(12) United States Patent
Hwang et al.

(10) Patent No.: US 8,310,012 B2
(45) Date of Patent: Nov. 13, 2012

(54) SEMICONDUCTOR DEVICE HAVING METAL GATE AND MANUFACTURING METHOD THEREOF

(75) Inventors: Guang-Yaw Hwang, Tainan County (TW); Yu-Ru Yang, Hsinchu County (TW); Jiunn-Hsiung Liao, Tainan Hsien (TW); Pei-Yu Chou, Tainan County (TW)

(73) Assignee: United Microelectronics Corp., Hsin-Chu (TW)

( * ) Notice: Subject to any disclaimer, the term of this patent is extended or adjusted under 35 U.S.C. 154(b) by 249 days.

(21) Appl. No.: 12/759,670

(22) Filed: Apr. 13, 2010

(65) Prior Publication Data
US 2011/0248359 A1 Oct. 13, 2011

(51) Int. Cl.
*H01L 29/78* (2006.01)
*H01L 21/3205* (2006.01)

(52) U.S. Cl. . 257/371; 257/411; 257/412; 257/E29.128; 257/E29.134; 438/592

(58) Field of Classification Search .................. 257/371, 257/411, 412, E29.128, E29.134; 438/592
See application file for complete search history.

(56) References Cited

U.S. PATENT DOCUMENTS

| 7,126,199 B2 * | 10/2006 | Doczy et al. | 257/412 |
| 2011/0147858 A1 * | 6/2011 | Lim et al. | 257/412 |

* cited by examiner

*Primary Examiner* — Minh-Loan T Tran
(74) *Attorney, Agent, or Firm* — Winston Hsu; Scott Margo

(57) ABSTRACT

A semiconductor device includes a semiconductor substrate, a gate dielectric layer formed on the semiconductor substrate, and at least a first conductive-type metal gate formed on the gate dielectric layer. The first conductive-type metal gate includes a filling metal layer and a U-type metal layer formed between the filling metal layer and the gate dielectric layer. A topmost portion of the U-type metal layer is lower than the filling metal layer.

17 Claims, 5 Drawing Sheets

SEMICONDUCTOR DEVICE HAVING METAL GATE AND MANUFACTURING METHOD THEREOF

BACKGROUND OF THE INVENTION

1. Field of the Invention

The invention relates to a semiconductor device having a metal gate and manufacturing method thereof, and more particularly, to a semiconductor device having a metal gate and manufacturing method applied with a gate last process.

2. Description of the Prior Art

Polysilicon is conventionally used as gate electrode in the semiconductor device, such as the metal-oxide-semiconductor (MOS). However, with a trend toward scaling down the size of the semiconductor device, the conventional polysilicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional polysilicon gate to be the control electrode that competent to the high-K gate dielectric layer.

In a complementary metal-oxide semiconductor (CMOS) device, one of the dual work function metal gates is used in an NMOS device and the other one is alternatively used in a PMOS device. It is well-known that compatibility and process control for the dual metal gate are more complicated, meanwhile thickness and composition controls for materials used in the dual metal gate method are more precise. The conventional dual metal gate methods are categorized into gate first process and gate last process. In a conventional dual metal gate method applied with the gate first process, the anneal process for forming the source/drain ultra-shallow junction, and the silicide process are performed after forming the metal gate. After the anneal process having such strict heat budget, it is found that a flat band voltage ($V_{fb}$) does not increase or decrease linearly with decrease of EOT of the high-K gate dielectric layer. Instead, a roll-off issue is observed. Therefore, the gate last process is developed to improve the $V_{fb}$ roll-off issue and avoid generating leakage current due to re-crystallization of the high-K gate dielectric layer happened in high-temperature processes, and to widen material choices for the high-K gate dielectric layer and the metal gate in the gate first process.

In the conventional gate last process, a dummy gate or a replacement gate is provided and followed by performing processes used to construct a normal MOS transistor. Then, the dummy/replacement gate is removed to form a gate trench. Consequently, the gate trench is filled with metals according to the different electrical requirement. It is found that the gate last process is able to avoid processes of high thermal budget and to provide wider material choices for the high-K gate dielectric layer and the metal gate. However, the gate last process still faces integrity requirements for the complicated processes and reliability requirement for the gate trench filling.

SUMMARY OF THE INVENTION

According to a first aspect of the present invention, there is provided a semiconductor device having metal gate. The semiconductor device includes a semiconductor substrate, a gate dielectric layer formed on the semiconductor substrate, and at least a first conductive-type metal gate formed on the gate dielectric layer. The first conductive-type metal gate further comprises a filling metal layer and a U-type metal layer that is formed between the gate dielectric layer and the filling metal layer. A topmost portion of the U-type metal layer is lower than the filling metal layer.

According to a second aspect of the present invention, there is provided a method of manufacturing a semiconductor device having metal gate. The method includes steps of providing a semiconductor substrate having a first conductive-type transistor, a second conductive-type transistor, and a dielectric layer embedding the first conductive-type transistor and the second conductive-type transistor formed thereon; removing gate conductive layers of the first conductive-type transistor and the second conductive-type transistor to form a first gate trench and a second gate trench respectively in the first conductive-type transistor and the second conductive-type transistor; forming a barrier layer respectively in the first gate trench and the second gate trench; forming a U-type metal layer in the first gate trench, the U-type metal layer is lower than the first gate trench; and forming a second metal layer respectively in the first gate trench and the second gate trench.

According to the semiconductor device having metal gate and manufacturing method provided by the present invention, the transistors are fabricated with the gate last process. Since high-temperature processes have already finished before constructing the metal gates of the transistors, the provided method is more applicable to form the transistor needed to avoid high heat budget. Furthermore, the U-type metal layer is provided not only to serve as the required work function metal, but also to improve the filling result of the filling metal layer. Therefore the semiconductor device having metal gate provided by the present invention has the advantage of improved reliability.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
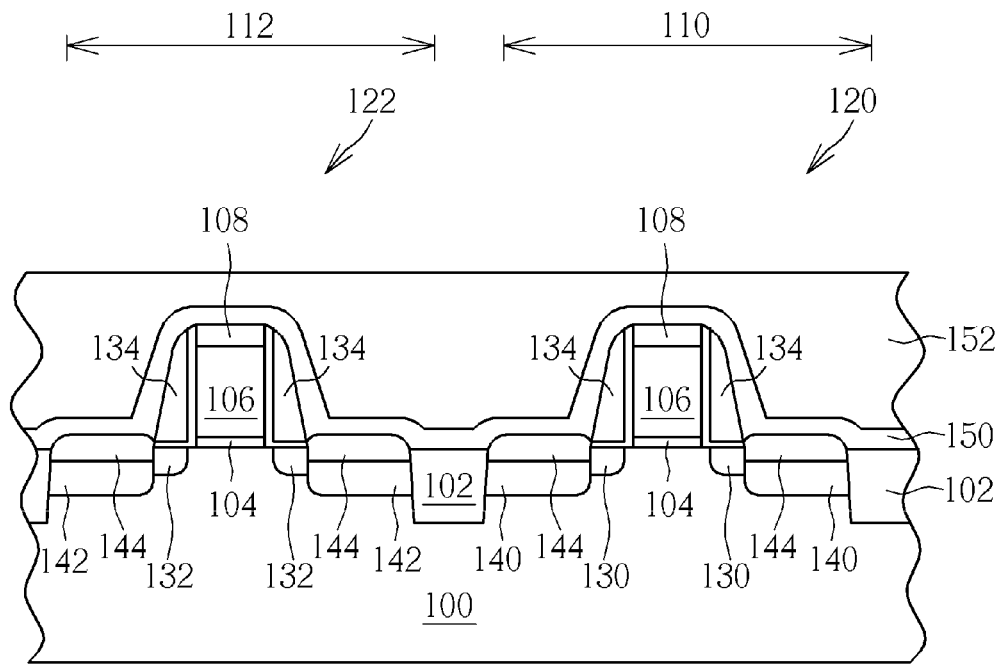
FIGS. 1-8 are schematic drawings illustrating a method of manufacturing a semiconductor device having metal gate provided by a first preferred embodiment of the present invention.

Please refer to FIGS. 1-8, which are schematic drawings illustrating a method of manufacturing a semiconductor device having metal gate provided by a first preferred embodiment of the present invention. As shown in FIG. 1, a semiconductor substrate 100 is provided. The semiconductor substrate 100 includes silicon substrate, silicon-containing substrate, or silicon-on-insulator (SOI) substrate. A first active region 110 and a second active region 112 are defined on the semiconductor substrate 100 and electrically isolated by a plurality of shallow trench isolations (STIs) 102. Then, a first conductive-type transistor 120 and a second conductive-type transistor 122 are formed on the semiconductor substrate 100 respectively in the first active region 110 and the second active region 112. In the preferred embodiment, the first conductive-type transistor 120 is a p-type transistor and the second conductive-type transistor 122 is an n-type transistor.

However, those skilled in the art would easily realize that it is not limited to have the first conductive-type transistor 120 being an n-type transistor while the second conductive-type transistor 122 being a p-type transistor.

As shown in FIG. 1, both of the first conductive-type transistor 120 and the second conductive-type transistor 122 include a gate dielectric layer 104, a gate conductive layer 106 such as a polysilicon layer, and a patterned hard mask 108. The gate conductive layer 106 serves as a dummy gate or a replacement gate. In the preferred embodiment, the gate dielectric layer 104 can be conventional silicon oxide (SiO) layer or a high-K gate dielectric layer. The high-k gate dielectric layer is selected from the group consisting of silicon nitride (SiN), silicon oxynitride (SiON) and metal oxide. And the metal oxide comprises hafnium oxide (HfO), hafnium silicon oxide (HfSiO), hafnium silicon oxynitride (HfSiON), aluminum oxide (AlO), lanthanum oxide (LaO), lanthanum aluminum oxide (LaAlO), tantalum oxide (TaO), zirconium oxide (ZrO), zirconium silicon oxide (ZrSiO), or hafnium zirconium oxide (HfZrO).

Please still refer to FIG. 1. The first conductive-type transistor 120 and the second conductive-type transistor 122 respectively include a first light doped drain (LDD) 130 and a second LDD 132, a spacer 134, and a first source/drain 140 and a second source/drain 142. The spacer 134 can be a multilayered structure comprising high temperature oxide (HTO), SiN, SiO or SiN formed by hexachlorodisilane ($Si_2Cl_6$) (HCD-SiN). Additionally, selective epitaxial growth (SEG) method can be utilized to form the first source/drain 140 and the second source/drain 142 in the preferred embodiment. For example, when the first conductive type transistor 120 is the PMOS transistor and the second conductive type transistor 122 is an NMOS transistor, epitaxial silicon layers with SiGe and SiC can be used to form the first source/drain 140 and the second source/drain 142, respectively. SEG method is applied in the preferred embodiment for further improving drain induced barrier lowering (DIBL) and punch-through effect and reducing off-state current leakage and power consumption. Thereafter, salicides 144 are formed on the first source/drain 140 and the second source/drain 142. After forming the first conductive-type transistor 120 and the second conductive-type transistor 122, a contact etch stop layer (CESL) 150 and an inter-layer dielectric (ILD) layer 150 are sequentially formed on the semiconductor substrate 100.

Figure 2:
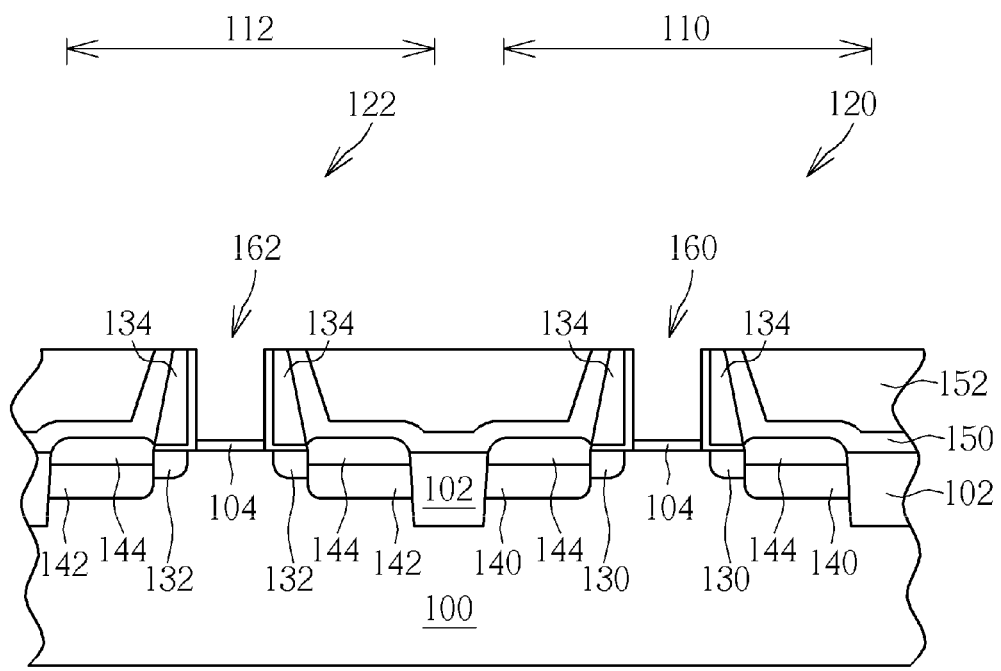

Please refer to FIG. 2. A planarization process such as a chemical mechanical polishing (CMP) process is performed to planarize the ILD layer 152 and the CESL 150, and then the patterned hard mask 108 is removed. Consequently, the gate conductive layers 106 are exposed. After the planarization process, an etching process is performed to remove the gate conductive layers 106 of the first conductive-type transistor 120 and the second conductive-type transistor 122 to form a first gate trench 160 and a second gate trench 162 respectively in the first conductive-type transistor 120 and the second conductive-type transistor 122. A shown in FIG. 2, the openings of the first gate trench 160 and the second gate trench are coplanar with the a surface of the ILD layer 152.

In the preferred embodiment, the gate dielectric layers 104 are respectively exposed in bottoms of the first gate trench 160 and the second gate trench 162. However, those skilled in art would easily realize that it is not limited to remove the gate dielectric layers 104 after removing the gate conductive layers 106. Then, high-K gate dielectric layers can be formed in the bottoms of the first gate trench 160 and the second gate trench 162 for further decreasing physical limit thickness and obtain equivalent capacitor in an identical EOT.

Figure 3:
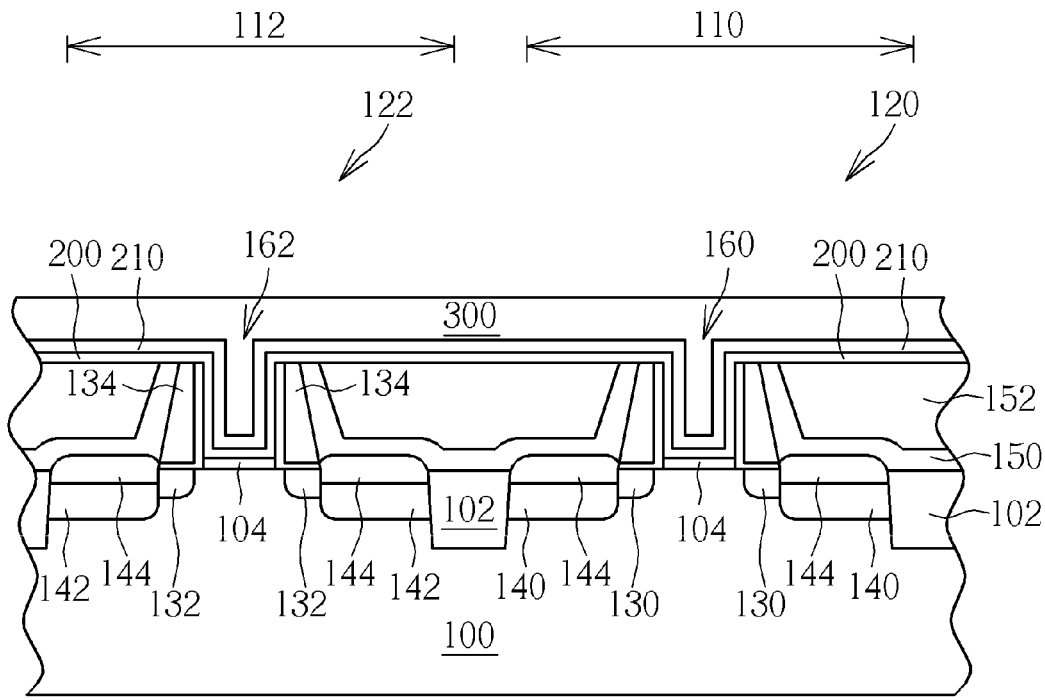

Please refer to FIG. 3. A barrier layer 200 and a first metal layer 210 are sequentially formed in both of the first gate trench 160 and the second gate trench 162. The first metal layer 210 serving as a work function metal required by a p-type transistor comprises titanium nitride (TiN) or tantalum carbide (TaC). It is noteworthy that the first conductive-type transistor 120 is a p-type transistor, therefore the metal gate of the first conductive-type transistor 120 is required to have a work function between about 4.8 eV and about 5.2 eV. Thus the first metal layer 210 is not limited to the material mentioned above, but also can be any proper material. The barrier layer 200 is a layer of which the etching rate is different from that of the first metal layer 210. In the preferred embodiment, the barrier layer 200 comprises tantalum nitride (TaN). After forming the first metal layer 210 and the barrier layer 200, a sacrificial layer having superior gap-filling ability, such as a bottom anti-reflective coating (BARC) layer, a spin-on glass (SOG) layer, or a photoresist 300 is formed on the semiconductor substrate 100. As shown in FIG. 3, the first gate trench 160 and the second gate trench 162 are filled with the photoresist 300.

Figure 4:
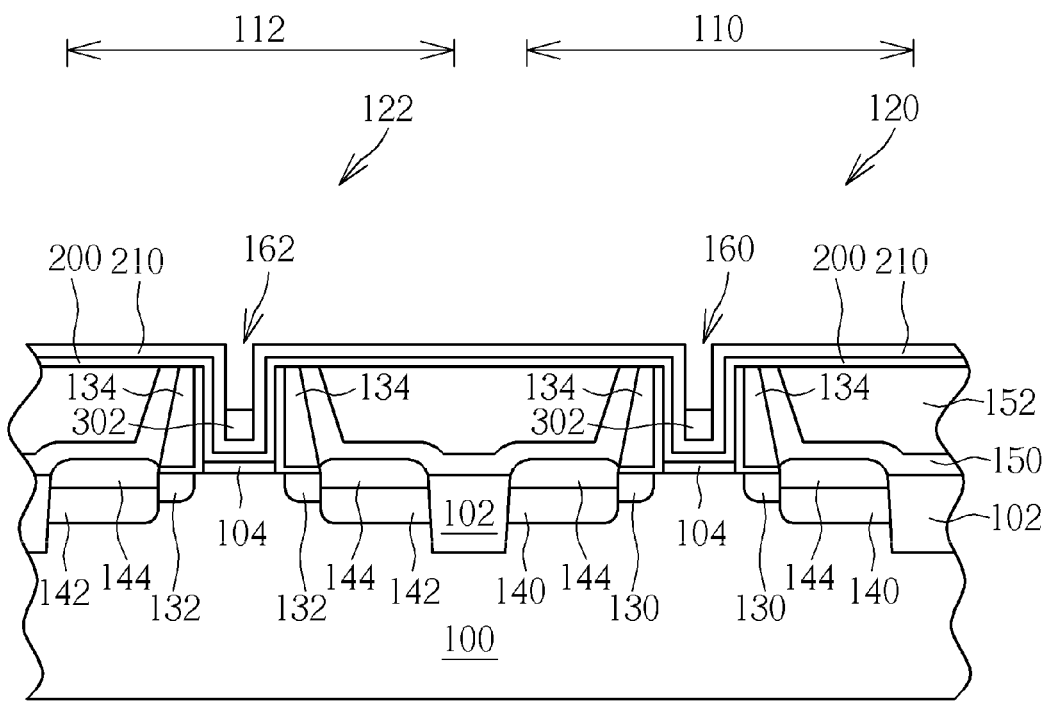

Please refer to FIG. 4. An etching back process is performed to remove a portion of the photoresist 300, thus a patterned photoresist 302 not completely filling the first gate trench 160 and the second gate trench 162 is obtained. In other words, a height of the patterned photoresist 302 is lower that the openings of the first gate trench 160 and the second gate trench 162. It is noteworthy that though the patterned photoresist 302 does not completely fill the first gate trench 160 and the second gate trench 162, it is still required to cover and protect the entire bottoms of the first gate trench 160 and the second gate trench 162. In the preferred embodiment, the patterned photoresist 302 is used to define the position and height of a U-type metal layer as shown in FIG. 4.

Figure 5:
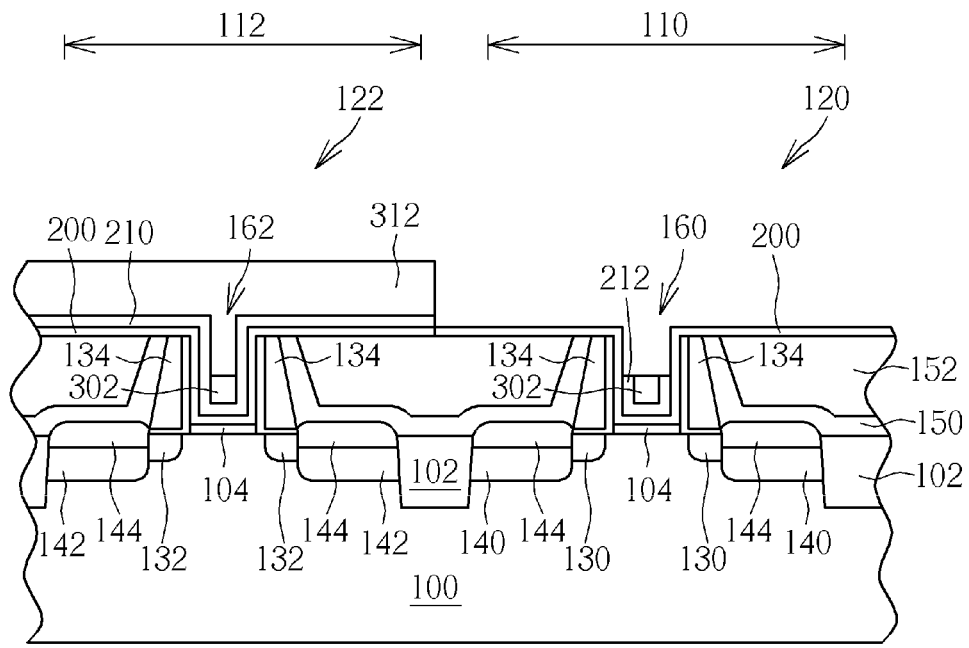

Please refer to FIG. 5. After forming the patterned photoresist 302, another photoresist (not shown) is formed on the semiconductor substrate 100 and followed by performing a photolithography. Thus a patterned photoresist 312 in the second active region 112 as shown in FIG. 5 is formed. In other words, the patterned photoresist 312 is formed on the second conductive-type transistor 122 and expose the first gate trench 160 in the first active region 110. Additionally, in order to ensure the patterned photoresist 302 being impervious to the photolithography for forming the patterned photoresist 312, it is well-known to those skilled in the art that a bake step can be performed to the patterned photoresist 302 before forming the patterned photoresist 312. Or, the patterned photoresist 312 is chosen from materials having etching rate different from the patterned photoresist 302.

Please refer to FIG. 5 again. Then, an etching process is performed to remove a portion of the first metal layer 210 in the first active region 110. Because a portion of the first metal layer 210 in the first gate trench 160 is protected by the patterned photoresist 302, a U-type metal layer 212 is obtained in the first gate trench 160 after the etching process. As shown in FIG. 5, topmost portions of the U-type metal layer 212 are lower than the opening of the first gate trench 160. Additionally, since the surface of the ILD layer 152 is coplanar with the openings of the first gate trench 160 and the second gate trench 162, the topmost portions of the U-type metal layer 212 are lower than the surface of the ILD layer 152.

Figure 6:
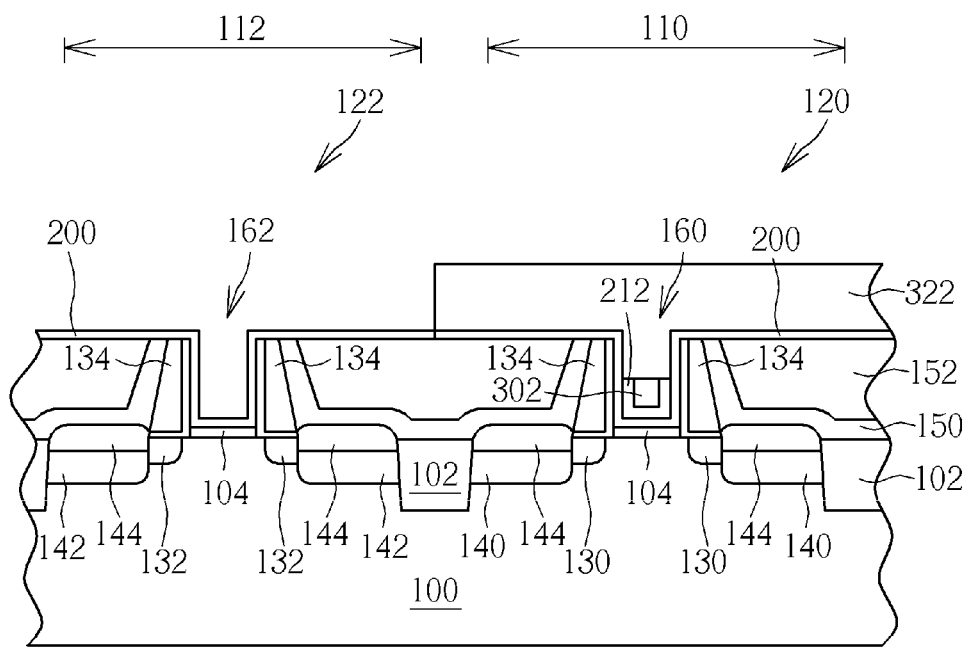

Please refer to FIG. 6. Next, The patterned photoresist 312 and the patterned photoresist 302 in the first gate trench 160 and the second gate trench 162 are sequentially removed and followed by forming a patterned photoresist 322 on the first conductive-type transistor 120 in the first active region 110.

As shown in FIG. 6, the patterned photoresist 322 exposes the second active region 112. Then, an etching process is performed to remove the first metal layer 210 in the second gate trench 162 in the second conductive-type transistor 122 of the second active region 112. Furthermore, the bottom of the second gate trench 162 is protected by the barrier layer 200 during the etching process used to remove the first metal layer 210, thus no damage is to be caused to the gate dielectric layer 104.

Figure 7:
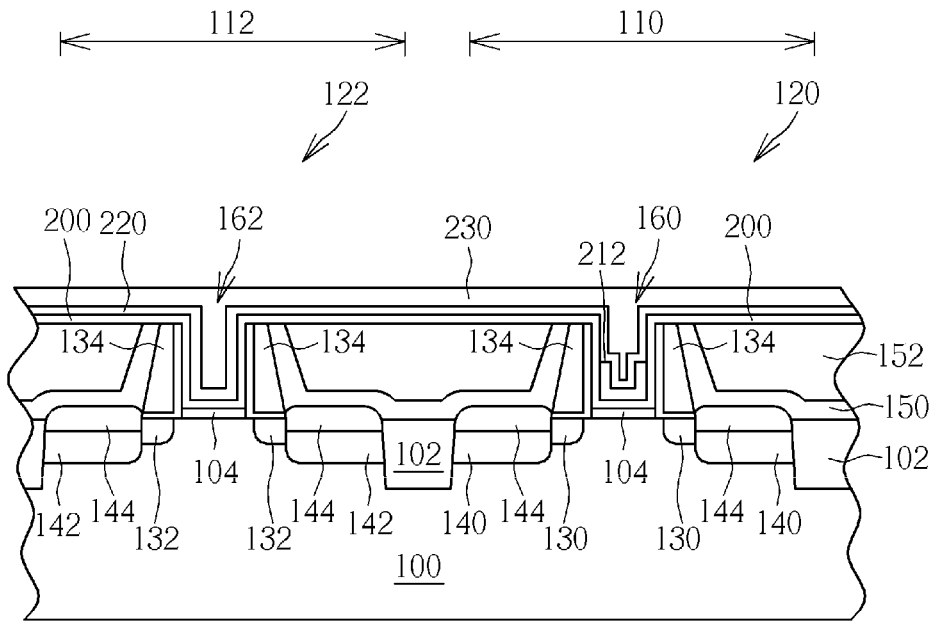

Please refer to FIG. 7. The patterned photoresist 322 is then removed and followed by sequentially forming a second metal layer 220 and a third metal layer 230 on the semiconductor substrate 100. The third metal layer 230 fills the first gate trench 160 and the second gate trench 162. Additionally, the barrier layer 200 can be removed before removing the second metal layer 220 and the third metal layer 230 according to the product or process requirements.

Figure 8:
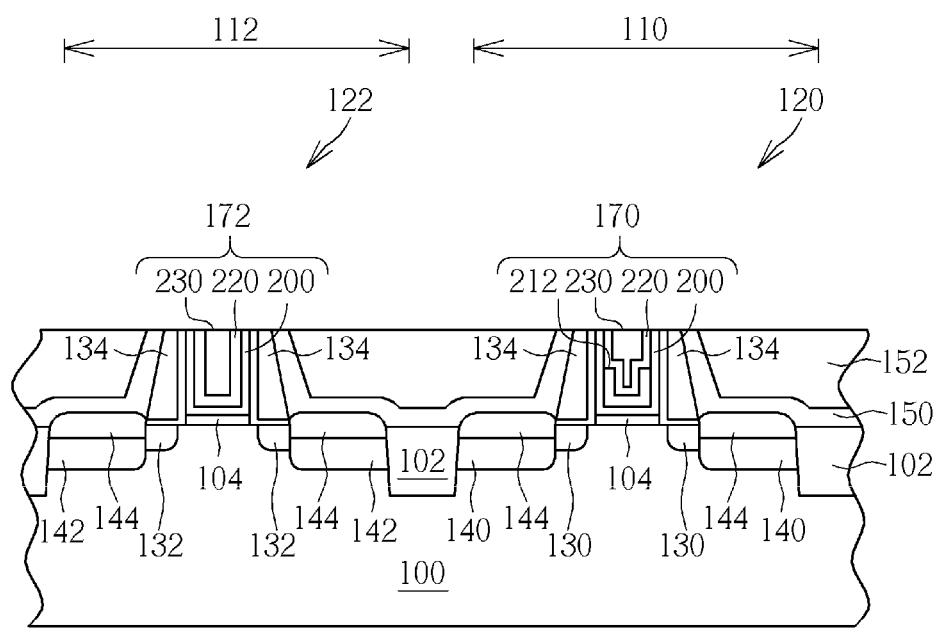

Please refer to FIG. 8. After the forming the second metal layer 220 and the third metal layer 230 that fills the first gate trench 160 and the second gate trench 162, a planarization is performed to remove unnecessary third metal layer 230, second metal layer 220 and barrier layer 200, thus an substantially even surface is obtained. Consequently, a first conductive-type metal gate 170 and a second conductive-type metal gate 172 are formed. After the planarization process, the surfaces of the ILD layer 152, the first conductive-type metal gate 170 and the second conductive-type metal gate 172 are coplanar. Since the planarization process is well-known to those skilled in the art, those details are omitted in the interest of brevity.

Please refer to FIG. 8 again. Because the first conductive-type transistor 120 is a p-type transistor and the second conductive-type transistor 122 is an n-type transistor in this preferred embodiment, the U-type metal layer 212 serves as work function metal in the first conductive-type metal gate 172. Thus, the first conductive-type metal gate 170 has a work function between about 4.8 eV and about 5.2 eV. Consequently, the second metal layer 220 and the third metal layer 230 are taken as a multi-layered metal film and the multi-layered metal film serves as a filling metal layer. It is noteworthy that due to the peculiar shape characteristics of the U-type metal layer 212, the upper opening of the first gate trench 160 is remained imperviously even after forming the U-type metal layer 212, and an aspect ratio of the first gate trench 160 is decreased. Therefore, the second metal layer 220 and the third metal layer 230 are able to fill the first gate trench 160 successfully without any seam left, and the reliability of the first conductive-type metal gate 170 is improved.

Furthermore, it is observed the work function of the first conductive-type metal gate is more susceptible to the portion of the U-type metal layer 212 that covers the bottom of the first gate trench 160 more than to the portion of the U-type metal layer 212 that covers the sidewalls of the first gate trench 160, therefore the patterned photoresist 302 can be chosen from photoresist material or any proper material that has etching rate substantially similar with the first metal layer 210. Thus, the first metal layer 210 and the portions of the patterned photoresist 302 that cover the sidewalls of the first gate trench 160 are simultaneously consumed during the etching process while the first metal layer 210 in the bottom of the first gate trench 160 is still protected by the patterned photoresist 302. Accordingly, the elevation drop between the topmost portion and the lowest portion of the U-type metal layer 212 is decreased and a flatter U-type metal layer 212 is obtained. The flatter U-type metal layer 212 makes the second metal layer 220 and third metal layer 230 fill the first gate trench 160 more easily.

Please still refer to FIG. 8. The second metal layer 220 is selected from the group consisting of TiAl, ZrAl, WAl, TaAl, and HfAl. The third metal layer 230 is selected from the group consisting of Al, Ti, Ta, W, Nb, Mo, Cu, TiN, TiC, TaN, Ti/W and Ti/TiN. Additionally, the third metal layer 230 can be a multi-layer structure. In the second conductive-type metal gate 172, the second metal layer 220 serves as the work function metal, thus the second conductive-type metal gate 172 has a work function between about 3.9 eV and about 4.3 eV, and the third metal layer 230 serves as a filling metal layer in the second conductive-type metal gate 172.

Figure 9:
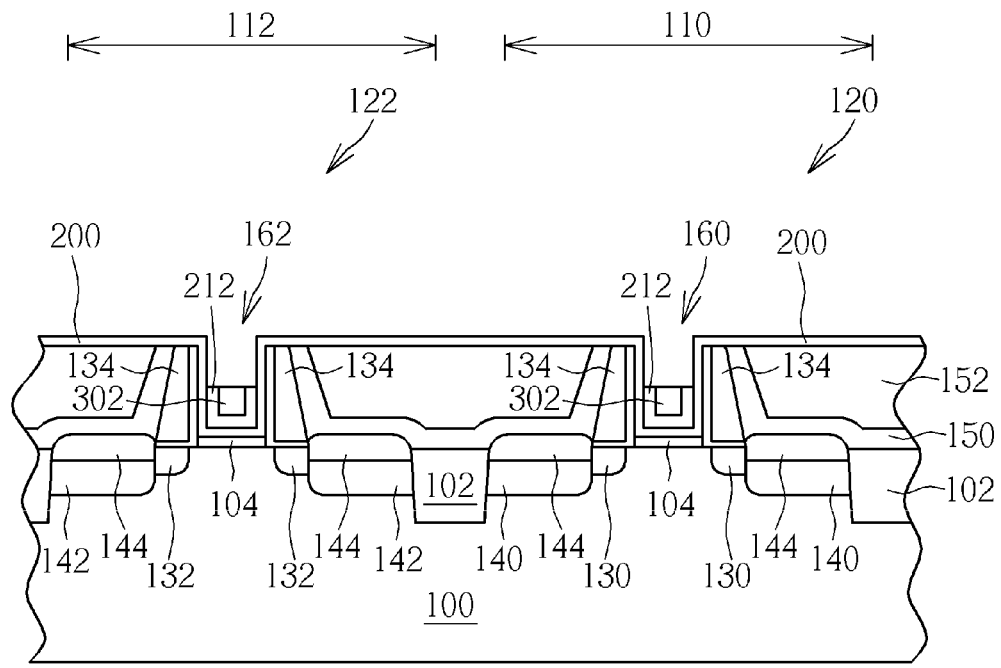
FIGS. 9-10 are schematic drawings illustrating a method of manufacturing a semiconductor device having metal gate provided by a second preferred embodiment of the present invention.
Figure 10:
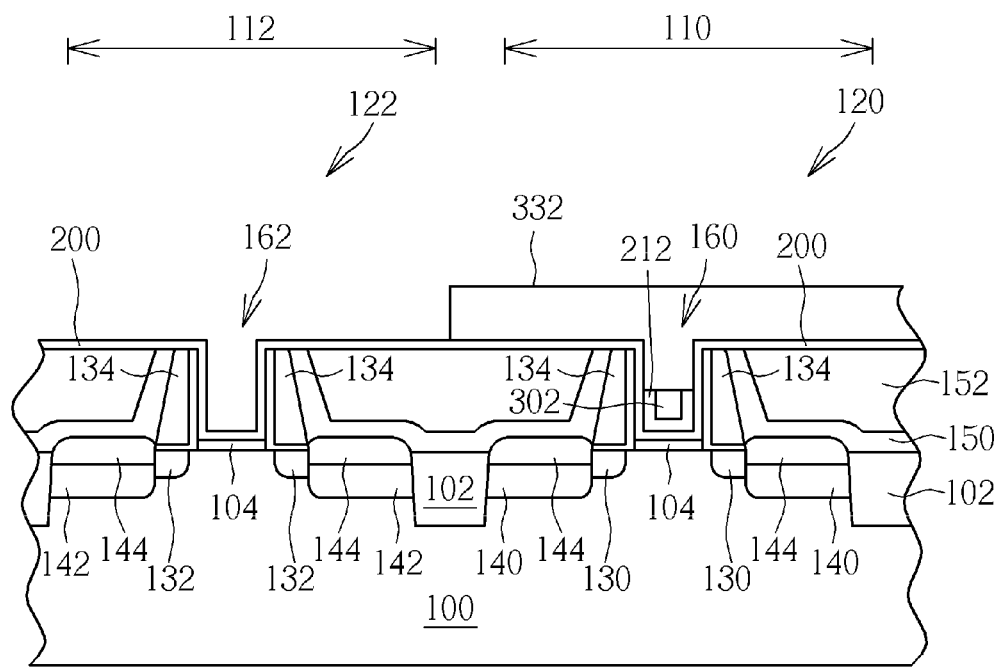

Please refer to FIGS. 9-10, which are schematic drawings illustrating a method of manufacturing a semiconductor device having metal gate provided by a second preferred embodiment of the present invention. Please note because steps of forming the first conductive-type transistor 120 and the second conductive-type transistor 122, forming the first gate trench 160 and the second gate trench 162, forming the barrier layer 200 and the first metal layer 210, and forming the patterned photoresist 302 in the second preferred embodiment are similar with the steps in the first preferred embodiment, those details are disclosed as mentioned above and shown in FIGS. 1-4, and are omitted in simplicity.

Please refer to both FIG. 4 and FIG. 9. After forming the patterned photoresist 302 in the first gate trench 160 and the second gate trench 162, an etching process is performed to remove the first metal layer 210 not covered by the patterned photoresist 302 in the first gate trench 160 and the second gate trench 162. Accordingly, U-type metal layers 212 are respectively formed in the first gate trench 160 and the second gate trench 162 as shown in FIG. 9. Due to the different etching rates between the barrier layer 200 and the first metal layer 210, the etching process stops at the barrier layer 200, and the sidewalls of the first gate trench 160 and the second gate trench 162 and the ILD layer 152 are protected thereby.

Please refer to FIG. 10. Then, a patterned photoresist 332 exposing the second active region 112 is formed on the first conductive-type transistor 120 in the first active region 110, as shown in FIG. 10, and followed by performing an etching process to remove the U-type metal layer 212 in the second gate trench 162 and in the second active region 112. As mentioned above, the gate dielectric layer 104 under the bottom of the second gate trench 162 is protected from the etching process by the barrier layer 200. Furthermore, in order to ensure the patterned photoresist 302 and the elements in the first active region 110 being impervious to the photolithography and etching processes for forming the patterned photoresist 332, it is conceivable to those skilled in the art that the patterned photoresist 332 is chosen from materials having etching rate different from the patterned photoresist 302. Such desired photolithography and etching results also can be achieved by making the patterned photoresist 332 thicker than the patterned photoresist 302.

After the etching process, the patterned photoresist 322 and the patterned photoresist 302 in the first gate trench 160 are sequentially removed and followed by forming the second metal layer 220 and the third metal layer 230, and performing the planarization process. Thus the first conductive-type metal gate 170 and the second conductive-type metal gate 172 are obtained. Since these steps are similar with that in the first preferred embodiment and FIGS. 7-8, those details are also omitted herein for simplicity.

The difference between the second preferred embodiment and the first preferred embodiment is: By using the different etching rates between the barrier layer 200 and the first metal layer 210, the etching process for forming the U-type metal layer 212 can be performed directly after forming the patterned photoresist 302. Consequently, the steps of forming the photoresist and performing the photolithography are economized.

Additionally, though the gate conductive layers 106 of the first conductive-type transistor 120 and the second conductive-type transistor 122 are simultaneously removed according to the first preferred embodiment and the second preferred embodiment, but it is not limited to sequentially remove the gate conductive layers 106 of the first conductive-type transistor 120 and the second conductive-type transistor 122.

According to the semiconductor device having metal gate and manufacturing method provided by the present invention, the transistors are fabricated with the gate last process. Since high-temperature processes have already finished before constructing the metal gates of the transistors, the provided method is more applicable to form the transistor needed to avoid high heat budget. Furthermore, the U-type metal layer is provided not only to serve as the required work function metal, but also improve the filling result of the filling metal layer. Therefore the semiconductor device having metal gate provided by the present invention has the advantage of improved reliability.

Those skilled in the art will readily observe that numerous modifications and alterations of the device and method may be made while retaining the teachings of the invention.

What is claimed is:

1. A semiconductor device having metal gate comprising:
a semiconductor substrate;
a gate dielectric layer formed on the semiconductor substrate; and
at least a first conductive-type metal gate formed on the gate dielectric layer, the first conductive-type metal gate further comprising:
a filling metal layer comprising at least a first metal layer and a second metal layer, the first metal layer being selected from the group consisting of TiAl, ZrAl, WAl, TaAl, and HfAl; and
a U-type metal layer formed between the gate dielectric layer and the filling metal layer, a topmost portion of the U-type metal layer is lower than the filling metal layer, and the first metal layer of the filling metal layer being positioned between the second metal layer and the U-type metal layer.

2. The semiconductor device of claim 1 further comprising an interlayer-dielectric (ILD) layer, and a surface of the ILD layer is coplanar with the first conductive-type metal gate.

3. The semiconductor device of claim 2, wherein the topmost portion of the U-type metal layer is lower than the ILD layer.

4. The semiconductor device of claim 1, wherein the gate dielectric layer comprises a high-K gate dielectric layer.

5. The semiconductor device of claim 1, wherein the filling metal layer comprises a multi-layered metal film.

6. The semiconductor device of claim 1, wherein the second metal layer is selected from the group consisting of Al, Ti, Ta, W, Nb, Mo, Cu, TiN, TiC, TaN, Ti/W, and Ti/TiN.

7. The semiconductor device of claim 1, wherein the first conductive-type metal gate comprises a work function between about 4.8 eV and about 5.2 eV.

8. The semiconductor device of claim 7, wherein the U-type metal layer comprises TiN or TaC.

9. The semiconductor device of claim 1 further comprising a second conductive-type metal gate, and the second conductive-type metal gate comprises a work function between about 3.9 eV and about 4.3 eV.

10. The semiconductor device of claim 9, wherein the second conductive-type metal gate comprises at least the filling metal layer.

11. The semiconductor device of claim 1, further comprising a barrier layer positioned between the U-type metal layer and the gate dielectric layer.

12. A method of manufacturing a semiconductor device having metal gate, comprising steps of:
providing a semiconductor substrate having a first conductive-type transistor, a second conductive-type transistor, and a dielectric layer embedding the first conductive-type transistor and the second conductive-type transistor formed thereon;
removing gate conductive layers of the first conductive-type transistor and the second conductive-type transistor to form a first gate trench and a second gate trench respectively in the first conductive-type transistor and the second conductive-type transistor;
forming a barrier layer respectively in the first gate trench and the second gate trench;
forming a U-type metal layer in the first gate trench, the U-type metal layer is lower than the first gate trench;
forming a second metal layer respectively in the first gate trench to cover the U-type metal layer and in the second gate trench, the second metal layer being selected from the group consisting of TiAl, ZrAl, WAl, TaAl, and HfA; and
forming a third metal layer covering the second metal layer in the first gate trench and the second gate trench.

13. The method of claim 12, wherein the step of forming the U-type metal layer further comprises sequentially forming a first metal layer and a patterned first photoresist respectively in the first gate trench and the second gate trench, the patterned first photoresist not completely filling the first gate trench and the second gate trench is used to define the U-type metal layer.

14. The method of claim 13, wherein the step of forming the U-type metal layer further comprises steps performed after forming the patterned first photoresist layer:
forming a patterned second photoresist exposing the first gate trench on the second conductive-type transistor;
removing the first metal layer not covered by the patterned first photoresist in the first gate trench to form the U-type metal layer in the first gate trench;
removing the patterned second photoresist and the patterned first photoresist layer;
forming a patterned third photoresist on the first conductive-type transistor; and
removing the first metal layer on the second conductive-type transistor and in the second gate trench.

15. The method of claim 13, wherein the step of forming the U-type metal layer further comprises steps performed after forming the patterned first photoresist layer:
removing the first metal layer not covered by the patterned first photoresist in the first gate trench and the second gate trench to form the U-type metal layer respectively in the first gate trench and the second gate trench;
forming a patterned fourth photoresist on the first conductive-type transistor; and
removing the U-type metal layer in the second gate trench.

16. The method of claim 12, wherein the U-type metal layer comprises TiN or TaC.

17. The method of claim 12 further comprising a step of forming a third metal layer performed after forming the second metal layer, and the third metal layer is selected from the group consisting of Al, Ti, Ta, W, Nb, Mo, Cu, TiN, TiC, TaN, Ti/W, and Ti/TiN.

* * * * *